United States Patent [19]

Sakashita et al.

[11] Patent Number: 5,398,080
[45] Date of Patent: Mar. 14, 1995

[54] TELEVISION RECEIVER FOR TERRESTRIAL BROADCASTING

[75] Inventors: Seiji Sakashita, Hirakata; Hiroaki Ozeki, Neyagawa; Ippei Kanno, Hirakata; Daisuke Hayashi, Osaka, all of Japan

[73] Assignee: Matsushita Electric Industrial Co., Ltd., Osaka, Japan

[21] Appl. No.: 70,751

[22] Filed: Jun. 3, 1993

[30] Foreign Application Priority Data

Jun. 3, 1992 [JP] Japan .................... 4-142472

[51] Int. Cl.⁶ .............................. H04N 5/50
[52] U.S. Cl. ....................... 348/735; 455/182.2
[58] Field of Search .................. 348/731, 735; H04N 5/50; 455/182.1, 182.2, 189.1, 190.1, 192.1, 192.2, 314; 375/97

[56] References Cited

U.S. PATENT DOCUMENTS

| | | | |
|---|---|---|---|
| 4,581,643 | 4/1986 | Carlson | 348/735 |
| 4,718,113 | 1/1988 | Rother et al. | 455/314 |
| 5,214,795 | 5/1993 | Suter | 455/182.2 |
| 5,233,425 | 8/1993 | Rabii | 348/735 |

FOREIGN PATENT DOCUMENTS

| | | | |
|---|---|---|---|
| 0005669 | 1/1988 | Japan | H04N 5/50 |
| 2-113608 | 4/1990 | Japan | H03D 7/18 |
| 3-60206 | 3/1991 | Japan | H03D 7/18 |

*Primary Examiner*—Victor R. Kostak
*Assistant Examiner*—Jeffery S. Murrell
*Attorney, Agent, or Firm*—Wenderoth, Lind & Ponack

[57] ABSTRACT

In a television receiver in which image frequency signals for desired signals are removed when television broadcasting signals are frequency-converted through a local oscillator and mixers, the local oscillator generates biaxial orthogonal signals to be frequency-converted by respective mixers, an output signal of one mixer being phase-shifted to be added to an output signal of the other mixer so as to thereby offset only the image frequency signals. The local oscillator and a phase shifter operate so as to follow the frequency change of the intermediate frequency signal so as to thereby stabilize the suppression of the image frequency signal.

5 Claims, 12 Drawing Sheets

TELEVISION RECEIVER FOR TERRESTRIAL BROADCASTING

BACKGROUND OF THE INVENTION

1. Field of the Invention

This invention relates to a television receiver for terrestrial broadcasting effectively used for multichannel television receivers.

2. Description of the Prior Art

Television broadcasting uses the terrestrial or CATV system. With the recent trend that the broadcasting channels have been increasingly multiplied, the CATV system broadcasting has multiplied as 100 channels have been announced. As a result, television receivers are required to be more improved in immunity than would be obtained in the prior art. In such a receiver, particularly, a tuner performs the frequency conversion of an input signal by a local oscillation signal. That is, the heterodyne system has been adopted which selects a desired signal as an intermediate frequency signal. Accordingly, an image frequency signal can be generated. In case that the intermediate frequency is largely apart in value from the input frequency, the image frequency signal also exists in the close vicinity of the input signal, so that it is difficult to be removed by a simple selecting filter.

Under such a circumstance, considerations are made recently on the fact that the upper and lower frequency signals of the local oscillation signal are changed in phase when frequency-converted into the intermediate frequency signal and as a result, such a method that the image frequency signals after frequency conversion are offset has been investigated. One example is disclosed in Japanese Laid-Open Patent Application No. 2-113608, and which comprises two mixers, a biaxial orthogonal local oscillation signal generator and a phase shifter for phase-shifting one of the output signals of the mixers. With such a structure, however, the phase shifter has a frequency limitation on the range of a 90-degree phase shift, making it impossible to follow the frequency change of a converter and resulting in the phase-shift amount not being 90 degrees. Thus, there arises a problem in that the image rejection performance is rapidly degraded.

In addition, another example is disclosed in Japanese Laid-Open Patent Application No. 3-60206, in which two mixers and a biaxial orthogonal local oscillation signal generator are provided and the phases of the output signals of the two mixers are compared to feedback the result to one of phase shifters so as to thereby offset the image frequency signals, and further in which the amplitudes of the output signals of the two mixers are compared to obtain the phase difference and the amplification factors of variable gain amplifiers which are disposed so as to receive the outputs of the mixers are changed in response to the phase difference so as to thereby offset the image frequency signals. With this structure, however, it is very difficult to change closely the amplitudes of the image frequency signals from the output signals of the mixers and as a result, it is required that there be no conversion gain difference between the two mixers in advance. In addition, two phase shifters or two variable gain amplifiers are needed, resulting in redundant circuit arrangement.

SUMMARY OF THE INVENTION

An object of this invention is to provide a television receiver which has a means of control-ling a phase shifter so as to have a phase shift of 90 degrees and a means of following the input frequency change to make variable the local oscillation frequency and the phase shifter so as to thereby suppress the image frequency signal so that the image rejection performance can be greatly improved as compared with that obtained previously.

In order to attain the above-mentioned object, a television receiver of this invention frequency-converts a desired signal which has been already frequency-converted via a converter and a channel selecting circuit into an intermediate frequency signal, by two mixers in response to respective biaxial orthogonal local oscillation signals. One of the output signals of the two mixers is phase-shifted and mixed with the other thereof to reject the image frequency signal. In this case, the phase difference error of the biaxial orthogonal local oscillation signal and the frequency variation part of the intermediate frequency signal are fed back to a local oscillator, so that the image frequency signal is suppressed while the frequency variation part thereof is being suppressed.

Or, the phase difference error of a phase shifter of the output signals of the two mixers is fed back to the phase shifter and furthermore, the frequency variation part of the intermediate frequency signal is fed back thereto, so that the image frequency signal is suppressed while the frequency variation part thereof is being suppressed.

Or, the output signals of the mixers including the desired signal are supplied to a frequency phase synchronizing circuit, the output signal of which is subjected to a phase shift of 45 degrees to be detected as the reference carrier of a detector. The frequency variation part is fed back thereto, thus suppressing the image frequency signal while the frequency variation part is being suppressed.

With the structures as above, the image frequency signal can be suppressed by following even to the frequency change of the intermediate frequency signal. Also, the image frequency signal can be rejected without using the phase shifter on the mixer side.

DESCRIPTION OF THE PREFERRED EMBODIMENTS

Figure 1:
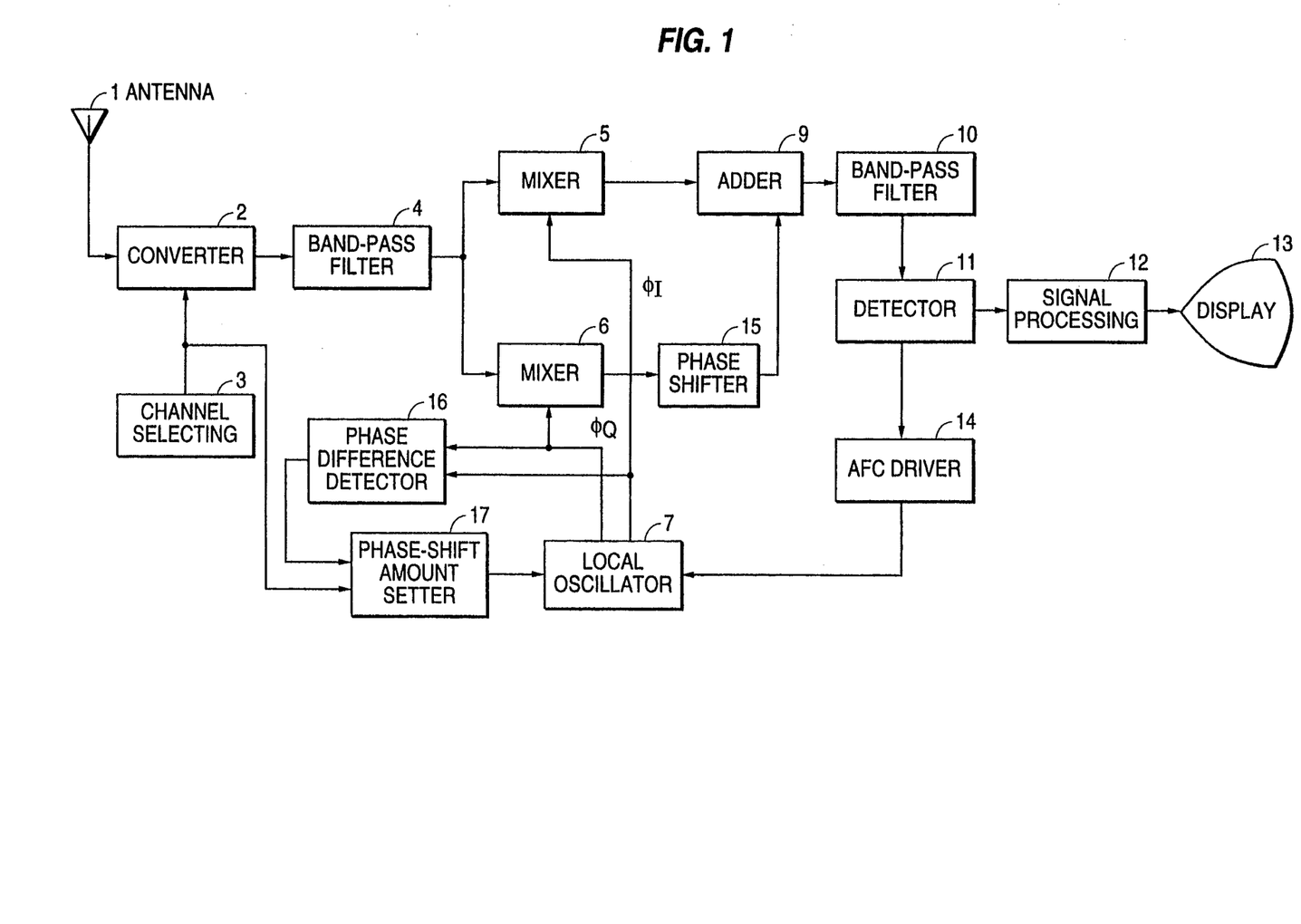
FIG. 1 is a block diagram of a television receiver according to a first embodiment of this invention.

FIG. 1 is a block diagram of a television receiver according to a first embodiment of this invention, in which high frequency signals sent from an antenna 1 are subjected to frequency conversion through a converter 2. In this case, a desired signal of the high frequency signals is converted into a first intermediate frequency signal in response to a channel selection control signal supplied from a channel selecting circuit 3.

The desired signal converted into the first intermediate frequency signal has unnecessary signals removed therefrom through a band-pass filter 4 and is delivered to mixers 5 and 6. A local oscillator 7 generates biaxial orthogonal local oscillation signals to be delivered respectively to the mixers 5 and 6 as well. As a result, the mixers 5 and 6 generate second intermediate frequency signals. However, the local oscillation signals are orthogonal in phase to each other, so that the second intermediate frequency signals of the mixers 5 and 6 are orthogonal in phase to each other.

Figure 20:
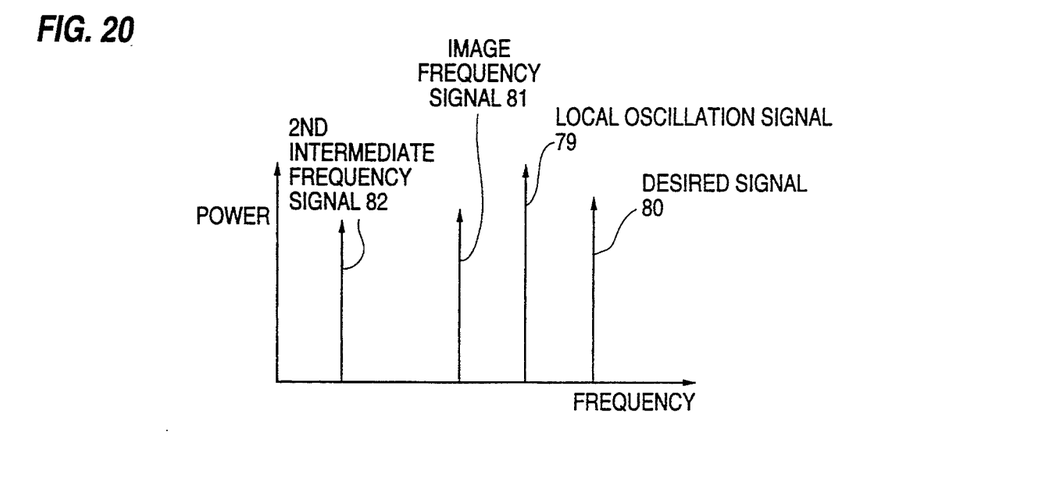
FIG. 20 is a diagram showing frequency spectra of an intermediate frequency signal, a local oscillation signal, an image frequency signal and a desired frequency signal.

The frequency relationship of the first and second intermediate frequency signals is shown in FIG. 20. The second intermediate frequency signal 82 is generated by mixing the desired signal 80 as the first intermediate frequency signal and the local oscillation signal 79. In this case, an image frequency signal 81 having an image frequency of the second intermediate frequency signal which is reduced in frequency by the second intermediate frequency is also mixed from the local oscillation signal 79 to form the second intermediate frequency signal. The mixers 5 and 6 generate the desired signals and image frequency signals in their output signals as shown above.

Figure 14:
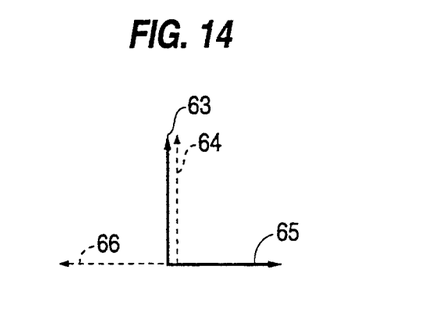
FIG. 14 is a input signal vector diagram of two mixers.

FIG. 14 is a vector diagram of the desired signals and the image frequency signals, in which the desired signals are indicated by the solid line vectors 63 and 65, and the image frequency signals are indicated by the broken line vectors 64 and 66. In FIG. 1, the mixer 5 is supplied with a signal $\Phi_I$ from the local oscillator 7 to generate the desired signal vector 63 and the image frequency signal vector 64. Also, the mixer 6 is supplied with a signal $\Phi_Q$ from the local oscillator 7 to generate the desired signal vector 65 and the image frequency signal vector 66.

Figure 15:
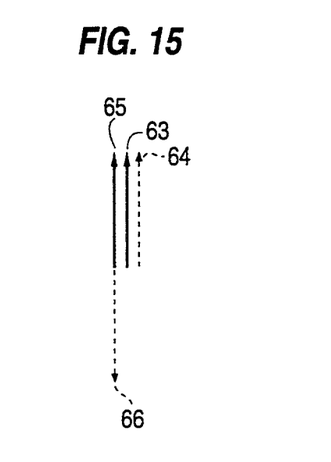
FIG. 15 is a input signal vector diagram of an adder.

Subsequently, the signals of the vectors 65 and 66 are sent to the phase shifter 15 to be subjected to the phase shift of 90 degrees and as a result, the vectors 65 and 64 and 63 are equal in phase and the vectors 64 and 66 are opposite in phase as shown in FIG. 15. These signals are supplied to an adder 9 such that the signals opposite in phase are offset. Namely, only the image frequency signal is eliminated.

The remained desired signals are sent through a band-pass filter 10 to a detector 11 to be detected whereby the television signal ms taken out and sent through a signal processing circuit 12 to a display circuit 13 to be displayed.

On the other hand, the detector 11 follows the input signal frequency when synchronized with a video carrier for detection, so that the input frequency variation component signal can be detected by a loop signal of its phase synchronizer or the signal that is frequency-detected. The signal thus detected is sent to an AFC driver 14 to be converted into a frequency control signal and supplied to the local oscillator 7. Thus, the frequency change due to the converter 2 is suppressed.

Furthermore, in order that the phase difference between the local oscillation signals $\Phi_I$ and $\Phi_Q$ is maintained at 90 degrees, the phase difference therebetween is detected through a phase difference detector 16 and supplied to a phase-shift amount setter 17 for controlling the phase shift of the signal $\Phi_Q$ of the local oscillator 7. Also, a necessary phase-shift amount set in advance when the channel selection is made, is sent from the channel selecting circuit 3 to the phase-shift amount setter 17 as a channel selection signal.

According to this embodiment, as explained above, a frequency control which feeds the variation of the input signal frequencies to the mixers back to the local oscillator can be executed and furthermore, the phase difference of the biaxial orthogonal signals of the local oscillator is detected thereby making variable the phase-shift amount of the orthogonal signals of the local oscillator. Consequently, the image rejection performance of a wide frequency bandwidth capable of following even a frequency change of the input signal can be obtained.

Figure 2:
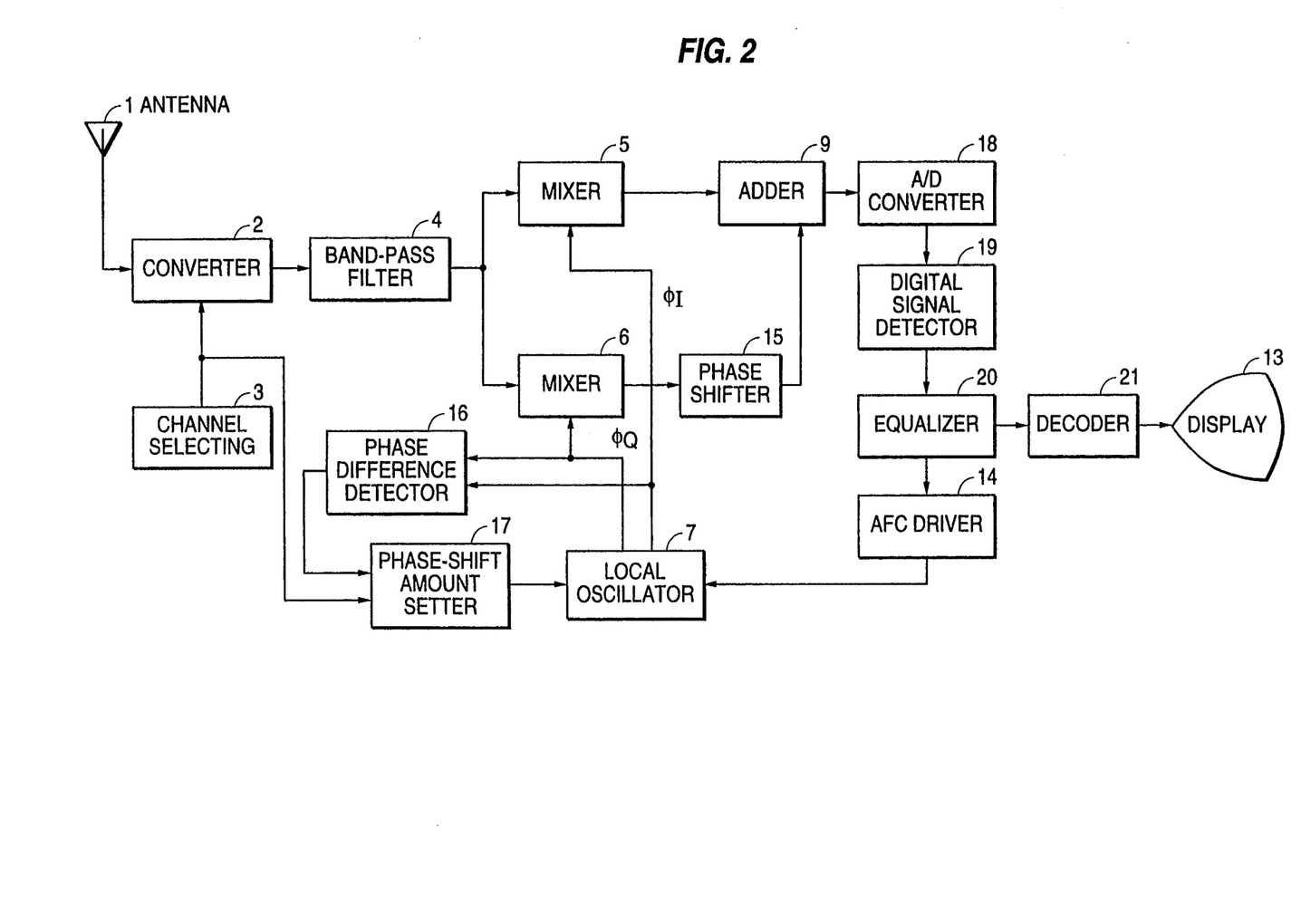
FIG. 2 is a block diagram of a television receiver according to a second embodiment of this invention.

FIG. 2 is a block diagram of a television receiver according to a second embodiment of this invention, in which high frequency signals from an antenna 1 are subjected to frequency conversion through a converter 2. In this case, a desired signal of the high frequency signals is converted into a first intermediate frequency signal in response to a channel selection control signal supplied from a channel selecting circuit 3.

The desired signal thus converted into the first intermediate frequency signal has unnecessary signals removed therefrom through a band-pass filter 4 and delivered to mixers 5 and 6. A local oscillator 7 generates biaxial orthogonal local oscillation signals to be delivered respectively to the mixers 5 and 6 as well. As a result, the mixers 5 and 6 generate second intermediate frequency signals. However, the local oscillation signals are orthogonal in phase to each other, so that the second intermediate frequency signals generated by the mixers 5 and 6 are orthogonal in phase to each other.

The frequency relationship of the first and second intermediate frequency signals is shown in FIG. 20, in which the second intermediate frequency signal 82 is generated by mixing the desired signal 80 as the first intermediate frequency signal and the local oscillation signal 79. In this case, an image frequency signal having an image frequency of the second intermediate frequency signal which is lower in frequency by the second intermediate frequency is also mixed from the local oscillation signal 79 to form the second intermediate frequency signal. The mixers 5 and 6 generate the desired signals and image frequency signals in their output signals as shown above.

FIG. 14 is a vector diagram of the desired signals and image frequency signals, in which the desired signals are indicated by the solid line vectors 63 and 65, and the image frequency signals are indicated by the broken line vectors 64 and 66. In FIG. 2, the mixer 5 is supplied with a signal $\Phi_I$ from the local oscillator 7 to generate the desired signal vector 63 and the image frequency signal vector 64. Also, the mixer 6 is supplied with a signal $\Phi_Q$ from the local oscillator 7 to generate the desired signal vector 65 and the image frequency signal vector 66.

Subsequently, the signals of the vectors 65 and 66 are sent to the phase shifter 15 to be subjected to a phase shift of 90 degrees and as a result, the vectors 65 and 64 and 63 are equal in phase and the vector 66 is opposite in phase as shown in FIG. 15. These signals are supplied to an adder 9 such that the signal which is opposite in phase is offset. Namely, only the image frequency signal is eliminated.

The remained desired signals are sent to an A/D converter 18 to be converted into digital signals, then, supplied through a digital detector 19 to an equalizer 20 to be waveform-shaped and sent to a decoder 21 for performing the signal processing of the television signal and supplied to a display device 13 to be displayed.

Figure 10:
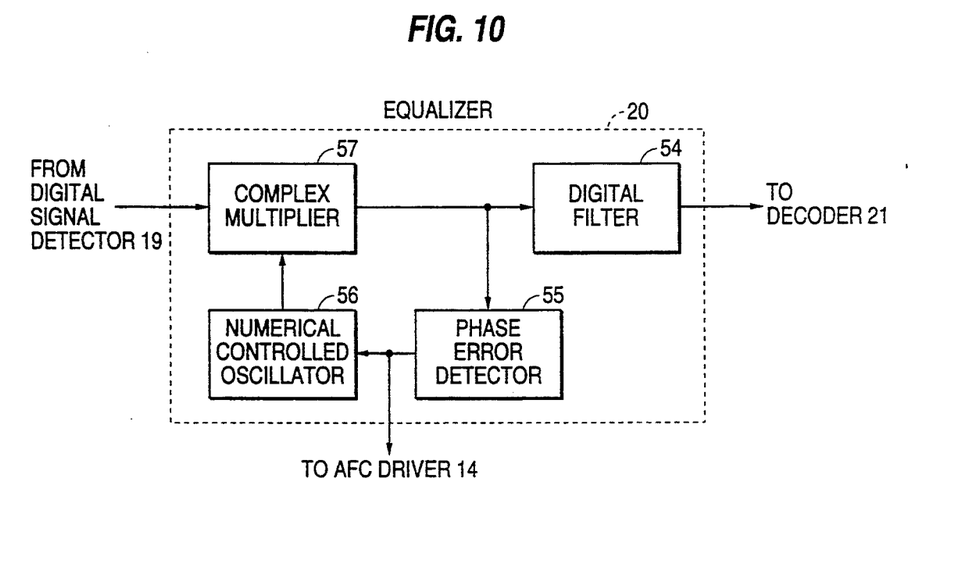
FIG. 10 is a block diagram of an equalizer consisting of a digital circuit.

On the other hand, the equalizer 20 shown in FIG. 10 waveform-shapes the input signal string through a complex multiplier 57 and a digital filter 54. In this case, if the input signal of the digital signal detector 19 contains a frequency variation component, the orthogonally axial phase difference can be detected by a phase error detector 55, and the oscillation frequency of a numerical-controlled oscillator 56 is changed in response to the signal thus detected so as to follow the input frequency of the digital signal detector 19. This signal is supplied to the complex multiplier 57 to perform the detection synchronized with the input frequency.

The signal thus obtained from the phase error detector 55 is sent to an AFC driver 14 to be converted into a frequency control signal and supplied to the local oscillator 7. Therefore, the frequency change due to the converter 2 is suppressed.

In addition, in order that the phase difference between the local oscillation signals $\Phi_I$ and $\Phi_Q$ is maintained at 90 degrees, the phase difference therebetween is detected through the phase difference detector 16 and supplied to a phase-shift amount setter 17 for controlling the phase shift of the signal $\Phi_Q$ of the local oscillator 7. Also, a necessary phase-shift amount set in advance when the channel selection is made is supplied from the channel selecting circuit 3 to the phase-shift amount setter 17 as a channel selection signal.

According to this embodiment, as explained above, a frequency control which feeds the variation of the input frequencies to the mixers back to the local oscillator can be executed even in digital broadcasting receiving and furthermore, the phase difference of the biaxial orthogonal signals is detected so as to thereby make variable the phase-shift amount of the orthogonal signals of the local oscillator. Consequently, the image rejection performance of wide frequency band capable of following even a frequency change of the input signal can be obtained.

Figure 3:
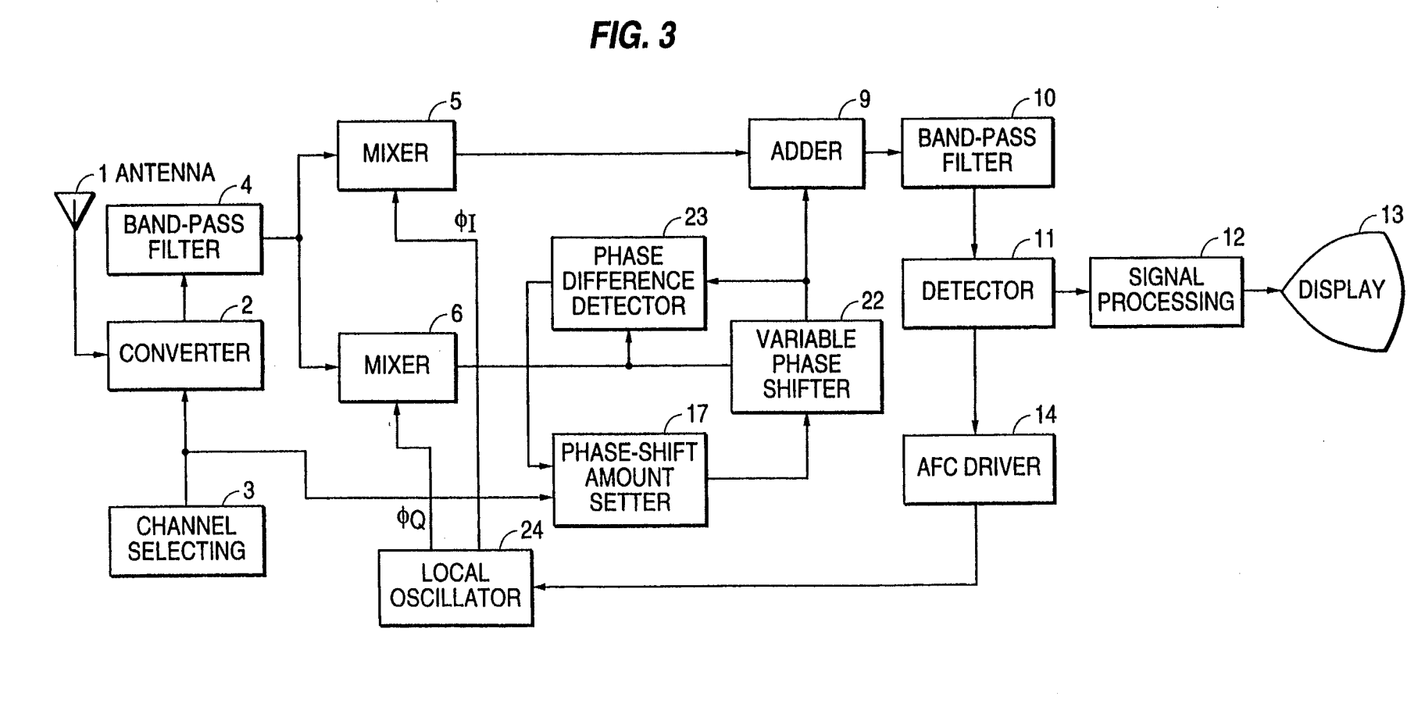
FIG. 3 is a block diagram of a television receiver according to a third embodiment of this invention.

FIG. 3 is a block diagram of a television receiver according to a third embodiment of this invention, in which high frequency signals sent from an antenna 1 are subjected to frequency conversion through a converter 2. In this case, a desired signal of the high frequency signals is converted into a first intermediate frequency signal in response to a channel selection control signal supplied from a channel selecting circuit 3.

The desired signal converted into the first intermediate frequency signal has unnecessary signals removed therefrom through a band-pass filter 4 and delivered to mixers 5 and 6. A local oscillator 24 generates biaxial orthogonal local oscillation signals to be delivered respectively to the mixers 5 and 6 as well. The mixers 5 and 6 generate second intermediate frequency signals. However, the local oscillation signals are orthogonal in phase to each other, so that the second intermediate frequency signals of the mixers 5 and 6 are orthogonal in phase to each other.

FIG. 20 shows the relationship of the frequencies of the first and second intermediate frequency signals. The second intermediate frequency signal 82 is generated by mixing the desired signal as the first intermediate frequency signal 80 and the local oscillation signal 79. In this case, an image frequency signal having an image frequency of the second intermediate frequency signal which is lower in frequency by the second intermediate frequency is also mixed from the local oscillation signal 79 to form the second intermediate frequency signal. The mixers 5 and 6 generated the desired signals and image frequency signals in their output signals as shown above.

FIG. 14 is a vector diagram of the desired signals and image frequency signals, in which the desired signals are indicated by the solid line vectors 63 and 65, and the image frequency signals are indicated by the broken line vectors 64 and 66. In FIG. 3, the mixer 5 is supplied with a signal $\Phi_I$ from the local oscillator 24 to generate the desired signal vector 63 and the image frequency signal 64. Also, the mixer 6 is supplied with a signal $\Phi_Q$ from the local oscillator 24 to generate the desired signal vector 65 and the image frequency signal vector 66.

Subsequently, the signals of the vectors 65 and 66 are sent to a variable phase shifter 22 to be subjected the phase shift of 90 degree and as a result, the vectors 65 and 64 and 63 are equal in phase and the vector 64 and 66 16 opposite in phase as shown in FIG. 15. These signals are supplied to an adder 9 such that the signal opposite in phase is offset. Namely, only the image frequency signal is eliminated.

The remaining desired signals are sent, through a band-pass filter 10 to a detector 11 to detect the television signal. The television signal thus detected is sent to a signal processing circuit 12 for performing signal processing and supplied to a display device 13 to be displayed.

The detector 11 is phase-synchronized with the input signal. In addition, a frequency detector detects an input frequency variation component. The frequency variation component thus detected is sent to an AFC driver 14 to be converted into a frequency control signal and supplied to a local oscillator 24. Therefore, the frequency change due to the converter 2 is suppressed.

Also, in order that the phase difference between an input signal and output signal of the variable phase shifter 22 is maintained at 90 degrees, the phase difference therebetween is detected by a phase difference detector 23 and supplied to a phase-shift amount setter 17 for controlling the phase shift of the variable phase shifter 22. Also, a necessary phase-shift amount set in advance when the channel selection is made, is supplied from the channel selecting circuit 3 to the phase-shift amount setter 17 as a channel selection signal.

According to this embodiment, as explained above, a frequency control which feeds the variation of the input signal frequencies to the mixers back to the local oscillator can be executed and furthermore, the phase-shift amount of the variable phase shifter for performing the phase shift of the second intermediate frequency signal is detected so as to thereby make variable the phase-shift amount so as to follow the change of the input frequency. Consequently, the image rejection performance of a wide frequency bandwidth capable of following even the frequency change of the input signal can be obtained.

Figure 4:
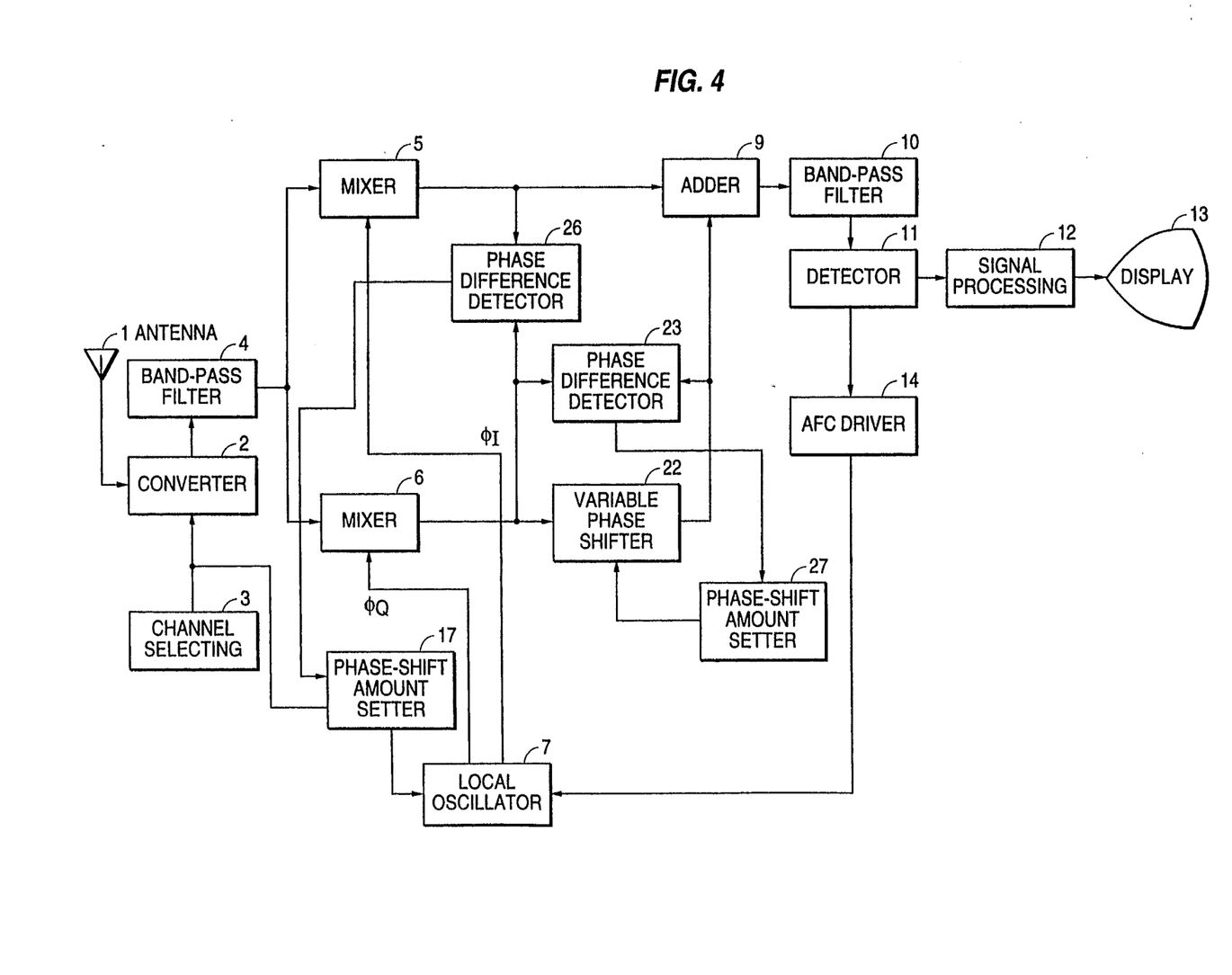
FIG. 4 is a block diagram of a television receiver according to a fourth embodiment of this invention.

FIG. 4 is a block diagram of a television receiver according to a fourth embodiment of this invention, in which high frequency signals sent from an antenna 1 are subjected to frequency conversion through a converter 2. In this case, a desired signal of the high frequency signals is converted into a first intermediate frequency signal in response to a channel selection control signal supplied from a channel selecting circuit 3.

The desired signal converted into the first intermediate frequency signal has unnecessary signals removed therefrom through a band-pass filter 4 and delivered to mixers 5 and 6. A local oscillator 7 generates biaxial orthogonal local oscillation signals to be delivered respectively to the mixers 5 and 6 as well. As a result, the mixers 5 and 6 generate second intermediate frequency signals. However, the local oscillation signals are orthogonal in phase to each other, so that the mixers 5 and 6 are orthogonal in phase to each other.

The frequency relationship of the first and second intermediate frequency signals is shown in FIG. 20, the explanations on which have been omitted for this embodiment because they are the same as those of the third embodiment.

In addition, the explanations for FIG. 14 showing a vector diagram of the desired signal and image frequency signal have been omitted here for the same reason as above.

Figure 5:
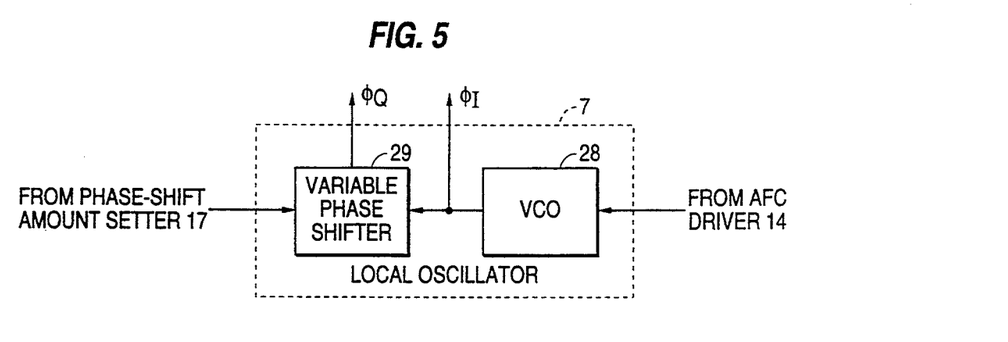
FIG. 5 is a block diagram of a biaxial orthogonal phase difference variable local oscillator of this invention.

The signals of the vector 65 and 66 are sent to a variable phase shifter 22 to be subjected to the phase shift of 90 degrees and as a result, the vectors 65 and 64 and 63 are equal in phase and the vector 66 is opposite in phase as shown in FIG. 5. These signals are supplied to an adder 9 such that the signals opposite in phase are offset. Namely, only the image frequency signal is eliminated.

The remained desired signals are sent through a band-pass filter 10 to a detector 11 to detect the television signal. The signal thus detected is sent to a signal processing circuit 12 to be signal-processed and supplied to display 13 to be displayed.

The detector 11 is phase-synchronized with the input signal. In addition, a frequency detector detects an input frequency variation component. The frequency variation component thus detected is sent to an AFC driver 14 to be converted into a frequency control signal and supplied to the local oscillator 7. Therefore, the frequency change due to the converter 2 is suppressed.

Also, in order that the phase difference between an input signal and output signal of the variable phase shifter 22 is maintained at 90 degrees, the phase difference therebetween is detected by a phase difference detector 23 and supplied to a phase shift amount setter 27 for controlling the phase shift of the variable phase shifter 22. Also, a necessary phase-shift amount set in advance when the channel selection is made is supplied to the phase-shift amount setter 17 as a channel selection signal.

The phase difference of the biaxial orthogonal signals $\Phi_I$ and $\Phi_Q$ of the local oscillator 7 is detected by phase-detecting the second intermediate frequency signals sent from the mixers 5 and 6 by a phase difference detector 26 and the result thus obtained is supplied to a phase-shift amount setter 17 for controlling the phase shift of the signal $\Phi_Q$ of the local oscillator 7. Also, a necessary phase-shift amount set in advance when the channel selection is made is supplied to the phase-shift amount setter 17 as a channel selection signal.

According to this embodiment, as explained above, a frequency control which feeds the variation of the input signal frequencies to the mixers back to the local oscillator can be executed and furthermore, the phase-shift amount of the variable phase shifter for performing the phase shift of the second intermediate frequency signal is detected so as to thereby make variable the phase-shift amount so as follow the change of the input frequency. Consequently, the image rejection performance of a wide frequency band capable of following even to the frequency change of the input signal can be obtained.

FIG. 5 is a block diagram of the local oscillator 7, in which a voltage-controlled oscillator (VCO) 28 changes the oscillation frequency in response to a frequency control voltage, and the oscillation signal thereof is supplied directly as the in-phase signal $\Phi_I$.

On the other hand, the oscillation signal from the VCO 28 is sent to a variable phase shifter 29 to change the phase-shift amount in response to an external control signal. The output signal of the variable phase shifter 29 is the orthogonal signal $\Phi_Q$.

Figure 6:
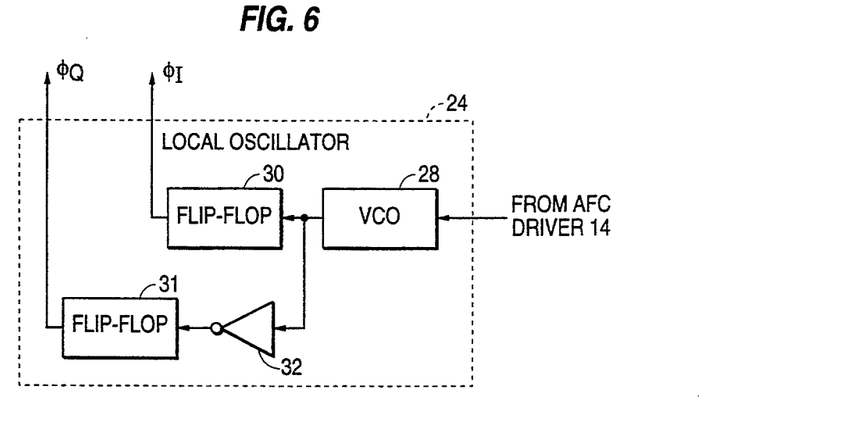
FIG. 6 is a block diagram of a biaxial orthogonal local oscillator of this invention.

FIG. 6 is a block diagram of the local oscillator 24, in which a voltage-controlled oscillator (VCO) 28 changes the oscillation frequency in response to a frequency control voltage, and the oscillation signal thereof is sent to a flip-flop 30 and the output signal thereof is supplied as the in-phase signal $\Phi_I$.

On the other hand, the oscillation signal from the VCO 28 is sent through an inverter 32 to a flip-flop 31 and the output signal thereof is the orthogonal signal $\Phi_Q$.

Figure 9:
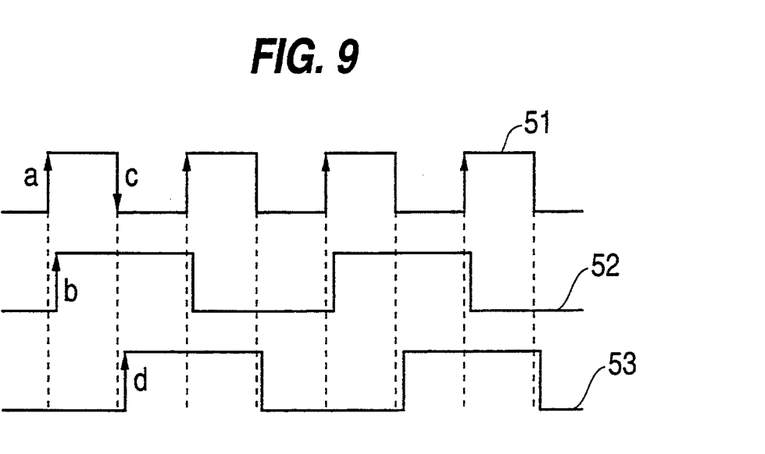
FIG. 9 is a diagram showing signal phases of a biaxial orthogonal local oscillator.

The waveforms of these signals are shown in FIG. 9. The oscillation waveform of the VCO 28 is indicated by waveform 51. The in-phase signal $\Phi_I$ is shown by waveform 52 by effecting the action of the flip-flop 30 at a rise time b which is synchronized with a rise time a of the waveform 51, and the orthogonal signal $\Phi_Q$ is as shown by waveform 53 by effecting the action of the flip-flop 31 at a rise time d synchronized with a rise time of the waveform 51.

Figure 7:
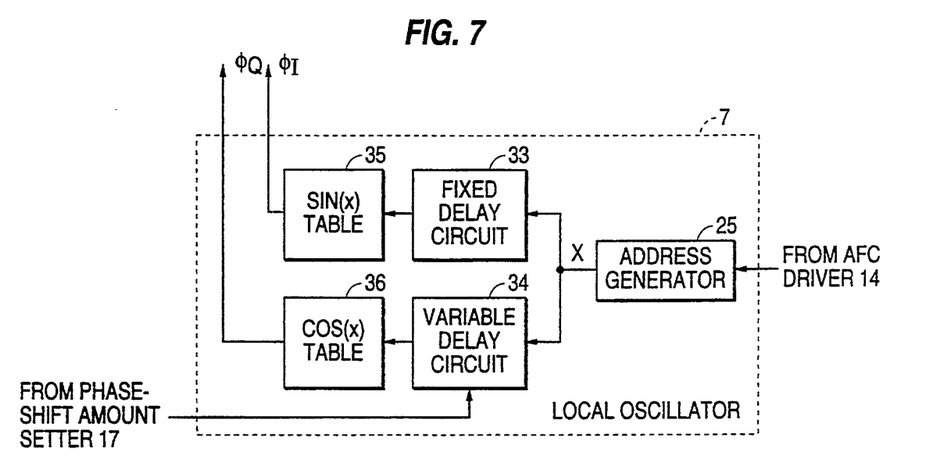
FIG. 7 is a block diagram of a biaxial orthogonal phase difference variable local oscillator of this invention.

FIG. 7 is a block diagram of the local oscillator 7 of this embodiment, in which an address generator 25 generates an address signal X of a memory in response to the frequency control voltage to deliver through a fixed delay circuit 33 and variable delay circuit 34 to a SIN(X) table 35 and COS(X) table 36. The variable delay circuit 34 delays a read address signal X in response to an external control signal to change the phase shift amount. An output signal of the SIN(X) table 35 is supplied as the in-phase signal $\Phi_I$.

On the other hand, an output signal of the COS(X) table 36 is supplied as the orthogonal signal $\Phi_Q$.

Figure 8:
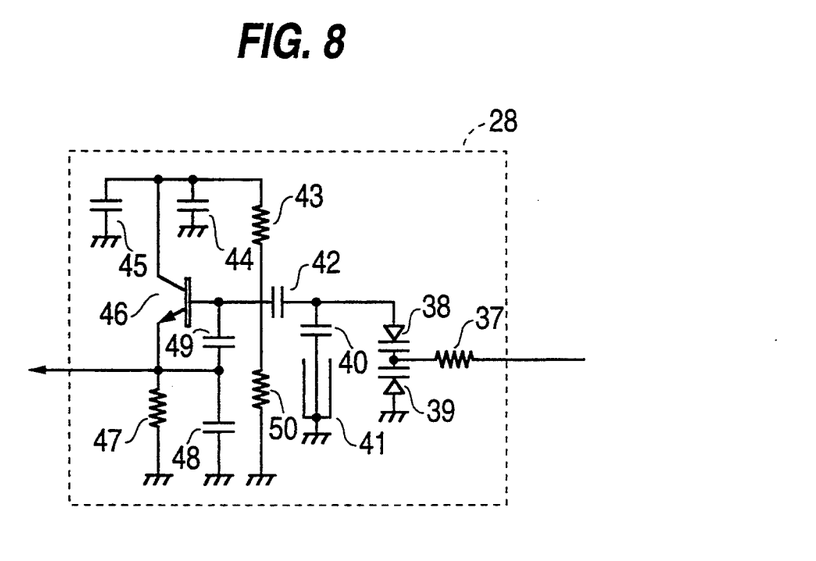
FIG. 8 is a circuit diagram of a voltage variable oscillator of this invention.

FIG. 8 is a circuit diagram of the VCO circuit 28 of this embodiment. The frequency control signal is sent via a resistor 37 to a resonance circuit consisting of variable capacity elements 38 and 39, a resonator 41 and an oscillator 40 to change its resonant frequency. Thus, the oscillation frequency can be changed.

Oscillation is effected through a transistor 46 and capacitors 42, 49 and 48 to generate a specified oscillation frequency determined by the resonance circuit. The oscillation signal is output from the emitter terminal of the transistor 46.

A DC power source 44 and resistors 43, 50 and 47 supply a bias voltage of the transistor 46, and a capacitor 45 is used for grounding.

Figure 11:
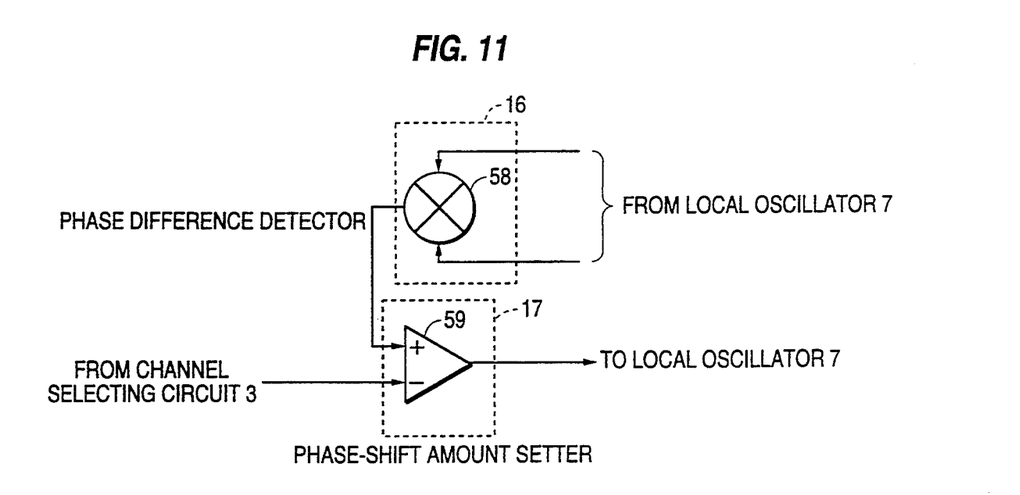
FIG. 11 is a circuit diagram of a phase difference detector and a phase-shift amount setter.

FIG. 11 is a circuit diagram showing concrete examples of the phase difference detector 16 and phase-shift amount setter 17. The phase difference detector 16 consists of a double-balance detector 58 for detecting a phase difference between two signals to generate a detection output signal so that if the phase difference between the two signals is 90 degrees, it outputs a zero (0), if it is small than 90 degrees, it outputs a negative voltage, and if it is larger than 90 degrees, it outputs a positive voltage.

Also, a phase-shift amount setter 17 consists of an operational amplifier 59 for mixing a control voltage from the channel selecting circuit 3 and a detection voltage from the phase difference detector 16.

Figure 12:
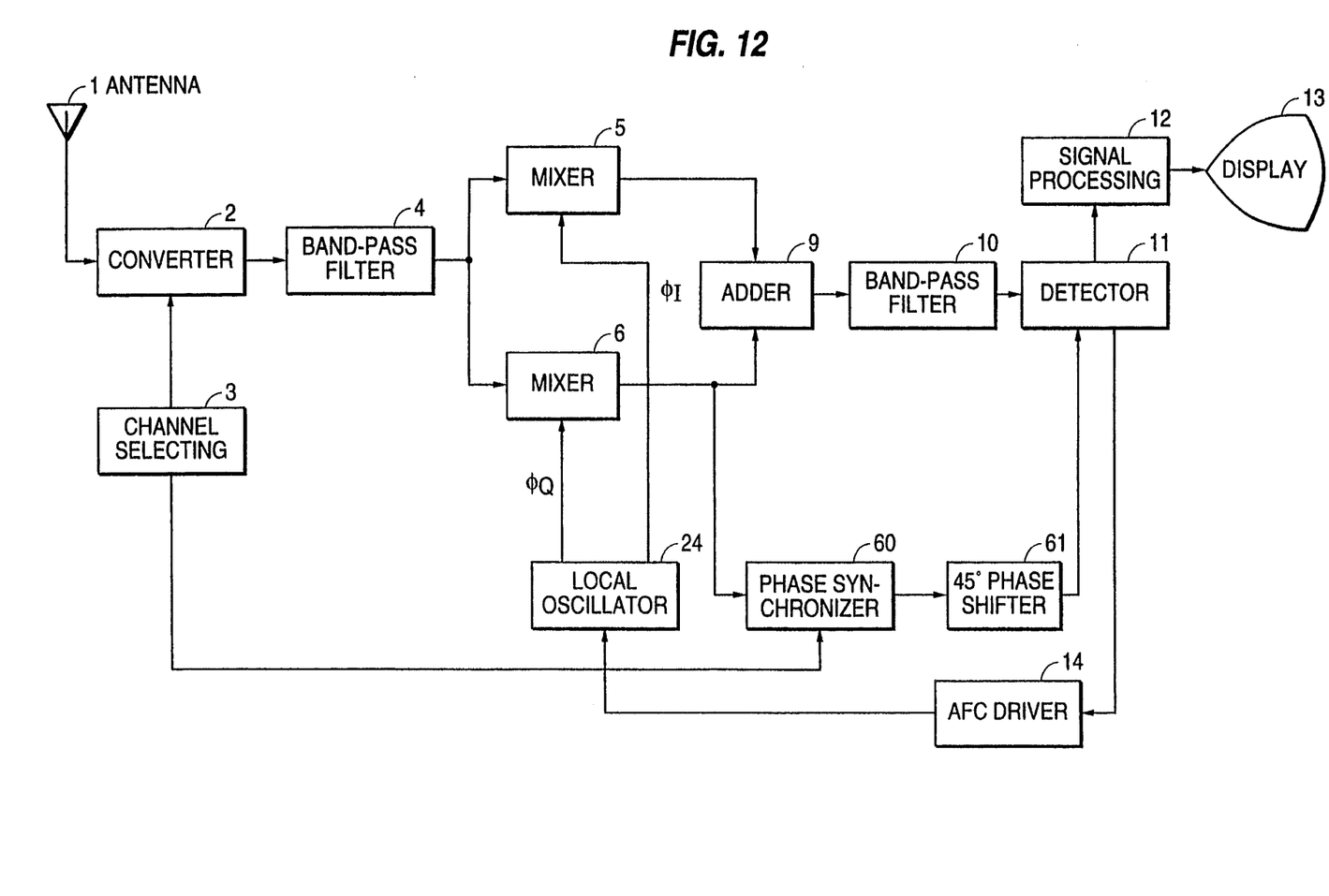
FIG. 12 is a block diagram of a television receiver according to a fifth embodiment of this invention.

FIG. 12 is a block diagram of a television receiver according to a fifth embodiment of this invention, in which high frequency signals from an antenna 1 are subjected to frequency conversion through a converter 2. In this case, a desired signal of the high frequency signals is converted into a first intermediate frequency signal in response to a channel selection control signal from a channel selecting circuit 3.

The desired signal thus converted into the first intermediate frequency signal has unnecessary signals removed therefrom through a band-pass filter 4 and delivered to mixers 5 and 6. A local oscillator 24 generates biaxial orthogonal local oscillation signals to be delivered respectively to the mixers 5 and 6. Thus, the mixers 5 and 6 generate second intermediate frequency signals. However, the local oscillation signals are orthogonal in phase to each other, so that the second intermediate frequency signals of the mixers 5 and 6 are orthogonal in phase to each other.

The frequency relationship of the first and second intermediate frequency signals is shown in FIG. 20. The second intermediate frequency signal 82 is generated by mixing the desired signal 80 as the first intermediate frequency signal and the local oscillation signal 79. In this case an image frequency signal 81 having an image frequency of the second intermediate frequency signal which is lower in frequency by the second intermediate frequency is also mixed from the local oscillation signal 79 to form the second intermediate frequency signal. The mixers 5 and 6 generate the desired signals and the image frequency signals.

FIG. 14 is a vector diagram of the desired signals and image frequency signals, in which the desired signals are indicated by the solid line vectors 63 and 65, and the image frequency signals are indicated by the broken line vectors 64 and 66. In FIG. 12, the mixer 5 is supplied with a signal $\Phi_I$ from the local oscillator 24 to generate the desired signal vector 63 and the image frequency signal vector 64. Also, the mixer 6 is supplied with a signal $\Phi_Q$ from the local oscillation signal 24 to generate the desired signal vector 65 and the image frequency signal vector 66.

Figure 16:
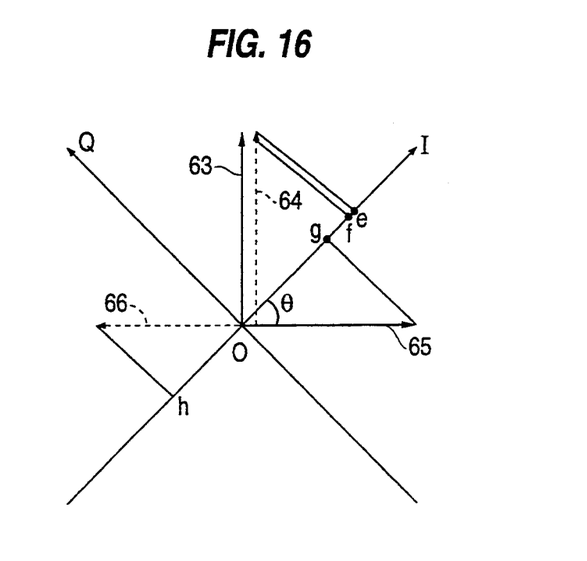
FIG. 16 is a diagram showing the detection axes and signal vectors in the fifth and sixth embodiments.

By mixing these signals by an adder 9, a vector diagram as shown in FIG. 16 can be obtained. This diagram is similar to that shown in FIG. 14 excepting that the vectors have their beginning points coupled with each other in the case of FIG. 16.

These mixed desired signals 63 and 65 and image frequency signals 64 and 66 are sent through a band-pass filter 10 to a detector 11.

On the other hand, the output signal of the mixer 6 is supplied to a phase synchronizer 60 to generate a signal synchronized with the second intermediate frequency. The signal thus obtained is supplied through a 45-degree phase shifter 61 to the detector 11 as a reference carrier. The signal axis I shown in FIG. 16 is the reference carrier axis as a detection axis. Analyzing through the axial system thus phase-shifted, the image frequency signal 64 becomes the vector Oe and the image frequency signal 66 becomes the vector Oh, which are reverse voltage signals. Also, the desired signal 63 becomes the vector of and the desired signal becomes the vector Og, which are in-phase signals. As a result, the phase of the detection axis I is changed so that the respective voltages Oe and Oh of the image frequency signals have values whose absolute values are equal, making it possible to eliminate the image frequency signal.

The phase-shift amount detected when channel-setting is supplied in advance from the channel selecting circuit 3 to the phase synchronizer 60.

The detector 11 is formed of a phase synchronizer for phase-synchronizing with the input frequency or a frequency detector so as to thereby detect the change of the input frequency. The output signal of the detector 11 is delivered to an AFC driver 14 to generate a control signal for suppressing the frequency variation and is sent to the local oscillator 24.

In addition, the detector 11 detects the television signal to output to a signal processing circuit 12 for signal-processing and then output to a display circuit 13 to be displayed.

According to this embodiment, as explained above, the phase shifter of the second intermediate frequency band is not needed, and the image frequency signal is eliminated by making variable the detection axis of the detector while following the second intermediate frequency signal. In addition, such a frequency control that feeds the variation of the input frequencies to the mixers back to the local oscillator can be provided. Consequently, the image rejection performance of a wide frequency band capable of following even the frequency change of the input signal can be obtained.

Figure 13:
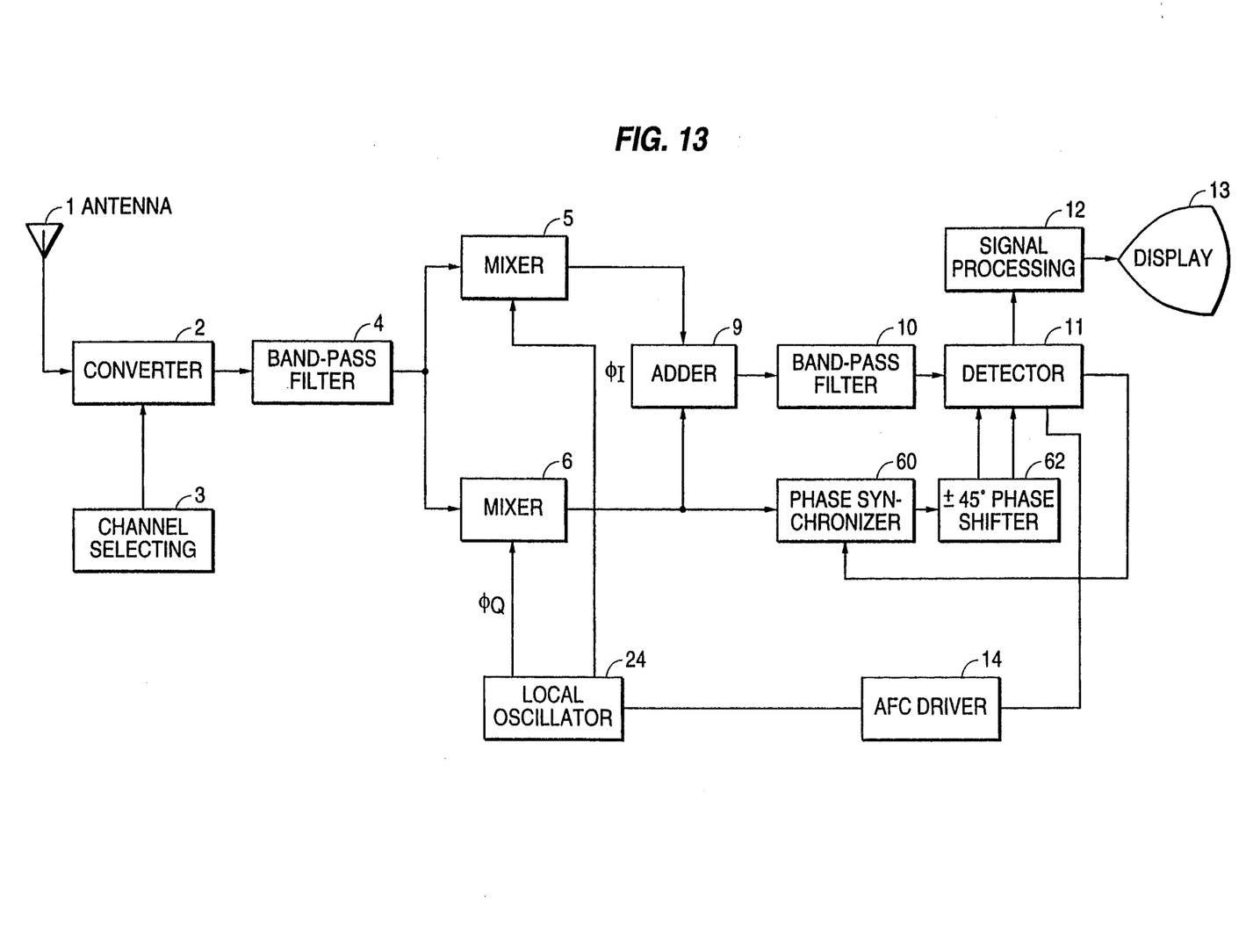
FIG. 13 is a block diagram of a television receiver according to a sixth embodiment of this invention.

FIG. 13 is a block diagram of a television receiver according to a sixth embodiment of this invention, in which high frequency signals from an antenna 1 are subjected to frequency conversion through a converter 2. In this case, a desired signal of the high frequency signal is converted into a first intermediate frequency signal in response to a channel selection control signal supplied from a channel selecting circuit 3.

The desired signal thus converted into the first frequency signal has unnecessary signals removed therefrom through a band-pass filter 4 and delivered to mixers 5 and 6. A local oscillator 24 generates biaxial orthogonal local oscillation signals to be delivered respectively to the mixers 5 and 6. Thus, the mixers 5 and 6 generate second intermediate frequency signals. However, the local oscillation signals are orthogonal in phase to each other, so that the second intermediate frequency signals of the mixers 5 and 6 are orthogonal in phase to each other.

The frequency relationship of the first and second intermediate frequency signals is shown in FIG. 20. The second intermediate frequency signal 82 is generated by mixing the desired signal 80 as the first intermediate frequency signal and the local oscillation signal 79. In this case, an image frequency signal having an image frequency of the second intermediate frequency signal which is lower in frequency by the second intermediate frequency is also mixed with the local oscillation signal 79 to form the second intermediate frequency signal. The mixers 5 and 6 generate the desired signals and the image frequency signals.

FIG. 14 is a vector diagram of the desired signals and image frequency signals, in which the desired signals are indicated by the solid line vectors 63 and 65, and the image frequency signals are indicated by the blocken line vectors 64 and 66. In FIG. 13, the mixer 5 is supplied with a signal $\Phi_I$ from the local oscillator 24 to generate the desired signal vector 63 and the image frequency signal vector 64. Also, the mixer 6 is supplied with a signal $\Phi_Q$ from the local oscillator 24 to generate the desired signal vector 65 and the image frequency signal vector 66.

These signal arc sent to an adder 9, whose vector diagram is shown in FIG. 16. This diagram is similar to that shown in FIG. 14 excepting that the vectors have their beginning points coupled with each other in the case of FIG. 16.

These mixed desired signals 63 and 65 and image frequency signals 64 and 66 are passed through a band-pass filter 10 to a detector 11.

On the other hand, the output signal of the mixer 6 is supplied to a phase synchronizer 60 to generate a signal synchronized with the second intermediate frequency. The signal thus obtained is supplied through a ±45-degree phase shifter 62 to the detector 11 as a-reference carrier. The signal axis I shown in FIG. 16 is the reference signal axis as a detection axis. Analyzing the axial system thus phase-shifted, the image frequency signal by becomes the vector Oe and the image frequency signal 66 becomes the vector Oh, which are reverse voltage signals. Also, the desired signal 63 becomes the vector Of and the desired signal 65 becomes the vector Og, which are in-phase signals. As a result, the phase of the detection axis I is changed so that the respective voltages Oe and Oh of the image frequency signals have values whose absolute values are equal, making possible to eliminate the image frequency signal. In the other hand, the detection using the axis Q reveals that the image frequency signals are added, thus the desired signal being suppressed. Therefore, the use of this axis for the detection signal of the image frequency signal makes it possible for the image frequency signal to be more accurately suppressed than that effected by the fifth embodiment.

Figure 18:
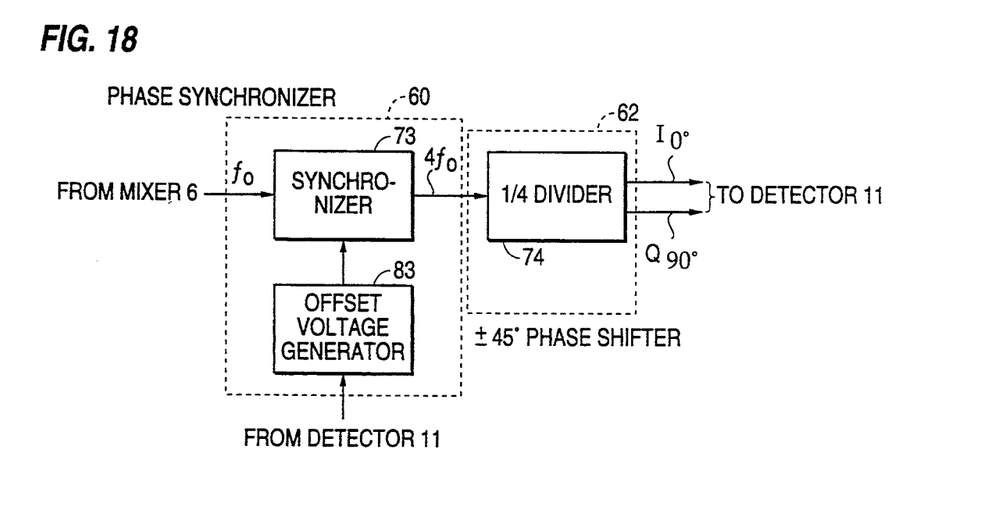
FIG. 18 is a block diagram of a phase synchronizer for synchronizing with an output signal of a mixer and a frequency divider.

FIG. 18 is a block diagram of the phase synchronizer 60 and the ±45-degree phase shifter 62 shown in FIG. 13. The phase synchronizer 60 consists of an offset voltage generator 83 for changing the phase angle when synchronizing and a synchronizer 73 for synchronizing with the input signal. The signal thus synchronized is sent to a quarter frequency divider 74 forming the ±45-degree phase shifter 62 to generate the orthogonal signals I and Q.

The detector 11 is formed of a phase synchronizer for phase-synchronizing with the input frequency or a frequency detector to detect the change of the input frequency. The output signal of the detector 11 is sent to an AFC driver 14 to generate a control signal or suppressing the frequency change and sent to the local oscillator 24.

In addition, the detector 11 detects the television signal to send out to a signal processing circuit 12 for signal-processing and then, sent to a display circuit 13 to be displayed.

According to this embodiment, as explained above, the phase shifter of the second intermediate frequency band is not needed, and the image frequency signal is eliminated by making variable the detection axis of the detector while following the second intermediate frequency signal. In addition, such a frequency control that feeds the variation of the input frequencies to the mixers back to the local oscillator can be provided. Consequently, the image removal performance of a wide frequency band capable of following even to the frequency change of the input signal can be obtained.

Figure 17:
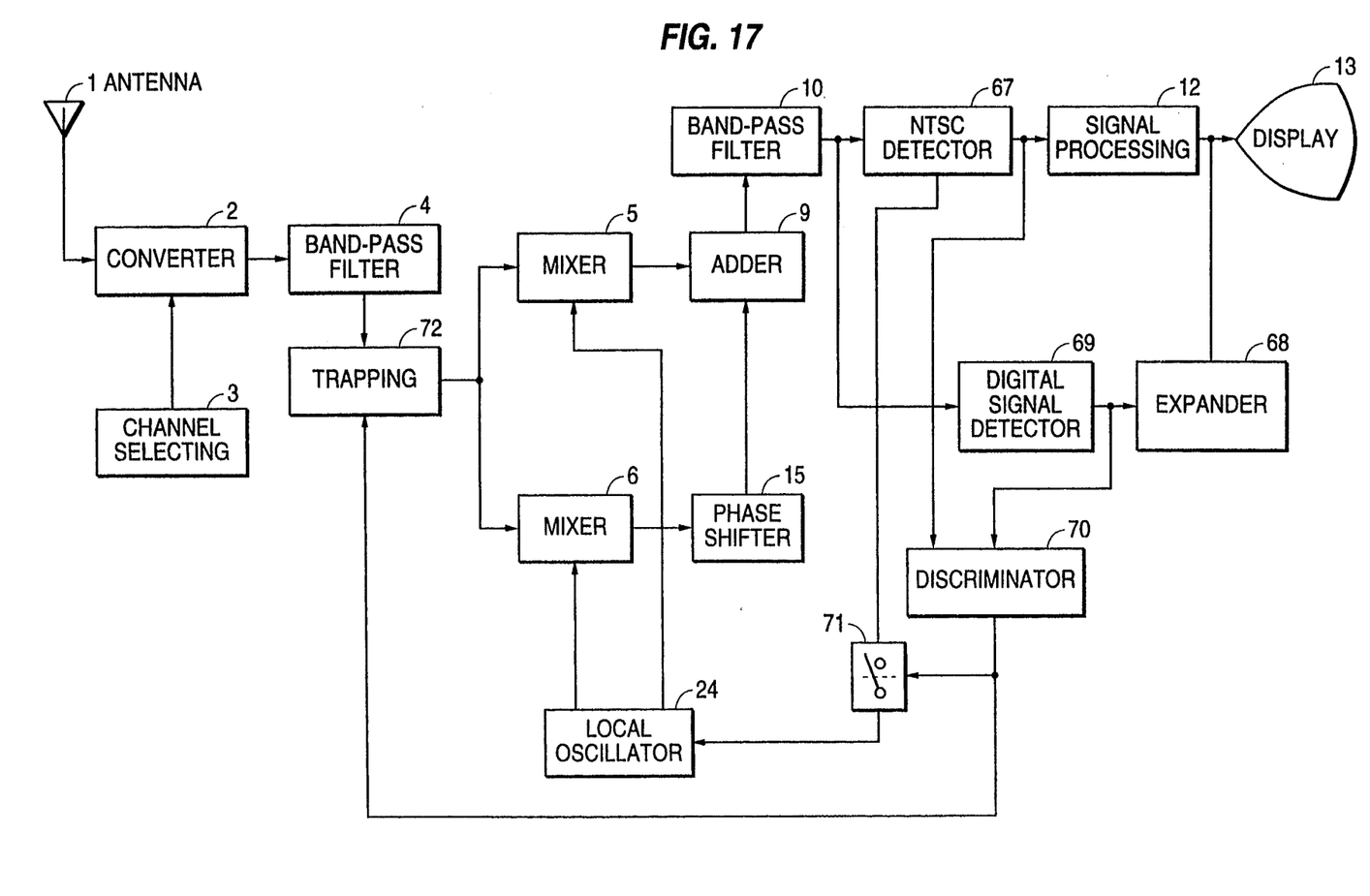
FIG. 17 is a block diagram of a television receiver according to a seventh embodiment of this invention.

FIG. 17 is a block diagram of a television receiver according to a seventh embodiment of this invention, in which high frequency signals from an antenna 1 are subjected to frequency conversion by a converter 2. In this case, a desired signal of the high frequency signals is converted into a first intermediate frequency signal in response to a channel selection control signal supplied from a channel selecting circuit 3.

The desired signal thus converted into the first intermediate frequency signal has unnecessary signals removed therefrom through a band-pass filter 4 and delivered to mixers 5 and 6. A local oscillator 24 generates biaxial orthogonal local oscillation signals to be delivered respectively to the mixers 5 and 6. Thus, the mixer 5 and 6 generate second intermediate frequency signals. However, the local oscillation signals are orthogonal in phase to each other, so that the second intermediate frequency signals of the mixers 5 and 6 are orthogonal in phase to each other.

The frequency relationship of the first and second intermediate signals is shown in FIG. 20. The second intermediate frequency signal 82 is generated by mixing the desired signal 80 as the first intermediate signal and the local oscillation signal 79. In this case, an image frequency signal 81 having an image frequency of the second intermediate frequency signal which is lower in frequency by the second frequency signal is also mixed with the local oscillation signal 79 to form the second intermediate frequency signal. The mixers 5 and 6 generate the desired signals and the image frequency signals.

FIG. 14 is a vector diagram of the desired signals and image frequency signals, in which the desired signals are indicated by the solid line vectors 63 and 65, and the image frequency signals are indicated by the broken line vectors 64 and 66. In FIG. 17, the mixer 5 is supplied with a signal $\Phi_I$ from the local oscillator 24 to generate the desired signal vector 63 and the image frequency signal vector 64. Also, the mixer 6 is supplied with a signal $\Phi_Q$ from the local oscillator 24 to generate the desired signal vector 65 and the image frequency signal vector 66.

Then, the output signal of the mixer 6 is sent through a phase shifter 15 to an adder 9 and the output signal of the mixer 5 is also sent to the adder 9, the vector diagram of which is shown in FIG. 15. As clear from FIG. 15, the image frequency signals 64 and 66 are offset.

The remained desired signals of the adder 9 are sent through a band-pass filter 10 to a NTSC detector 67. In the NTSC detector 67, the detection is made analogically to generate the television signal, then, signal-processed through a signal processing circuit 12 and sent to a display circuit 13 to be displayed.

On the other hand, the output signal of the band-pass filter 10 is supplied to a digital detector 69 to perform the digital signal detection, then, expanded through an expander 68 and displayed by the display circuit 13.

The NTSC detector 67 is formed of a phase synchronizer for phase-synchronizing with the input frequency or a frequency detector so as to thereby detect the change of the input frequency. The output signal of the NTSC detector 67 is supplied through a switch circuit 71 to the local oscillator 24 as a control signal for suppressing the frequency change.

Also, in the NTSC broadcasting case, a trapping circuit 72 is operated by a discriminator 70 for discriminating a modulated signal from the output signals of the NTSC detector 67 and digital signal detector 69, and the switch circuit 71 is closed to feed the variation of the input frequency back to the local oscillator 24.

Also, in the digital broadcasting case, the trapping circuit 72 is not operated and the switch circuit 71 remains open.

Figure 19:
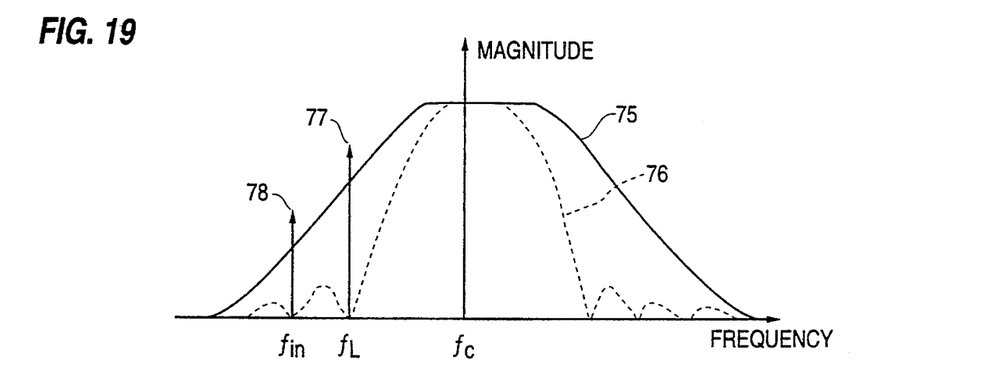
FIG. 19 is a diagram showing a magnitude characteristic of an intermediate frequency band.

The first intermediate frequency band characteristic in this case is shown in FIG. 19, in which the solid line curve 75 shows the characteristic of the band-pass filter 4 and the broken line curve 76 shows the characteristic thereof when the trapping circuit 72 is being operated. The NTSC signal is closer in detection limit on the image frequency signal than the digital signal and an the other hand, the digital signal is closer in the amplitude characteristic in the frequency band than the NTSC signal.

According of this embodiment, as explained above, the television receiver of this invention can be used in common for NTSC and digital broadcasting. Furthermore, such a frequency control that feeds the variation of the input frequency to the mixers back to the local oscillator can be provided. Consequently, the image rejection performance of a wide frequency band capable of following even to the input frequency change can be obtained.

What is claimed is:

1. A television receiver comprising:
    a channel selector, said channel selector generating a channel selection signal for selecting a desired signal of high frequency signals inputted from an antenna;
    a frequency converter, said frequency converter frequency-converting the desired signal of high frequency signals into an intermediate frequency signal in response to the channel selection signal from the channel selector;
    a local oscillation signal generator, said generator being capable of changing oscillation frequencies of biaxial orthogonal local oscillation signals;
    a first mixer and a second mixer, said first and second mixers frequency-converting said intermediate frequency signal in response to the respective biaxial orthogonal local oscillation signals;
    a phase shifter, said phase shifter phase-shifting an output signal of the first mixer by 90 degrees;
    an adder, said adder adding an output signal of said phase shifter and an output signal of the second mixer;
    a detector, said detector detecting an output signal of the adder;
    a frequency variation controller, said controller feeding a variation of the intermediate frequency outputted from said detector back to said local oscillation signal generator;
    a phase difference detector, said phase difference detector detecting a phase difference between said biaxial orthogonal local oscillation signals; and
    a phase-shift amount setter, said setter adding said channel selection signal from the channel selector to an output signal of the phase difference detector to generate a signal to change a phase-shift amount, whereby image frequency signals are offset when frequency conversion is carried out.

2. A television receiver as claimed in claim 1, wherein the local oscillation signal generator supplies an output signal of a voltage-variable frequency control oscillator which is coupled to the frequency variation controller and an output signal of a variable phase shifter which is coupled to the voltage-variable frequency control oscillator and the phase shifter for shifting a phase of the output signal of the voltage-variable frequency control oscillator in accordance with an output signal of the phase shifter.

3. A television receiver as claimed in claim 1, wherein the local oscillation signal generator supplies a first frequency-divided output which is obtained by frequency dividing an output signal of a voltage-variable frequency control oscillator by a predetermined dividing ratio and a second frequency-divided signal which is obtained by phase-inverting and frequency-dividing the output signal of said voltage-variable frequency control oscillator by said predetermined dividing ratio.

4. A television receiver as claimed in claim 1, wherein the local oscillation signal generator supplies via a fixed delay circuit an address signal of a numerical address generator to a sine function signal memory to read a sine function value and simultaneously, supplies via a variable delay circuit an address signal of said numerical address generator to a cosine function signal memory to provide a cosine function value.

5. A television receiver as claimed in claim 1, wherein the frequency variation controller converts a phase error signal of a waveform equalization circuit into a frequency control signal of the local oscillation signal generator.

* * * * *